US007550393B2

(12) United States Patent
    Jeong

(10) Patent No.: US 7,550,393 B2
(45) Date of Patent: Jun. 23, 2009

(54) SOLID-STATE IMAGING DEVICE WITH REDUCED SMEAR

(75) Inventor: Hee-Geun Jeong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 358 days.

(21) Appl. No.: 11/046,957

(22) Filed: Jan. 31, 2005

(65) Prior Publication Data

US 2005/0194611 A1    Sep. 8, 2005

(30) Foreign Application Priority Data

Feb. 13, 2004    (KR) ............... 10-2004-0009657

(51) Int. Cl.
    *H01L 21/302*    (2006.01)
    *H01L 21/461*    (2006.01)
(52) U.S. Cl. .............. 438/733; 438/734; 257/146
(58) Field of Classification Search ........... 257/59, 257/72, 146, 222, 225, 232, 234, 79; 438/749, 438/734, 733, FOR. 416, FOR. 417
    See application file for complete search history.

(56) References Cited

U.S. PATENT DOCUMENTS 4,970,382 A * 11/1990 Yamazaki et al. ....... 250/214 R
5,343,060 A    8/1994 Abe ........................... 257/229
5,576,239 A * 11/1996 Hatano et al. ................ 438/69
6,468,826 B1 * 10/2002 Murakami et al. ........... 438/48
6,746,939 B2 * 6/2004 Shimozono et al. ......... 438/471
7,119,363 B2 * 10/2006 Satou et al. ................... 257/49
7,135,725 B2 * 11/2006 Kato ........................... 257/291

OTHER PUBLICATIONS

Japanese Patent No. JP11087674 to Abe, having Publication date of Jun. 12, 2001 (w/ English Abstract page).
Japanese Patent No. JP2000252452 to Masayuki et al., having Publication date of Nov. 13, 2001 (w/ English Abstract page).
Japanese Patent Application No. 05-170343 to Masaru et al. entitled "Solid-State Image Sensing Element" (w/ English Abstract page).
Japanese Patent Application No. 09-007661 to Takashi entitled "Solid-State Imaging Element and Its Manufacturing Method" (w/ English Abstract page).

* cited by examiner

*Primary Examiner*—Phuc T Dang
*Assistant Examiner*—Thanh Y Tran
(74) *Attorney, Agent, or Firm*—Monica H. Choi

(57) ABSTRACT

A solid-state imaging device includes a light sensor formed in a semiconductor substrate. In addition, the solid-state imaging device includes a light block layer with an opening formed through the light block layer over at least a portion of the light sensor. Furthermore, at least one sidewall of the light block layer facing the opening is concave shaped for reducing smear phenomenon.

8 Claims, 6 Drawing Sheets

SOLID-STATE IMAGING DEVICE WITH REDUCED SMEAR

BACKGROUND OF THE INVENTION

This application claims priority to Korean Patent Application No. 2004-9657 filed on Feb. 13, 2004, in the Korean Intellectual Property Office, the content of which is incorporated herein by reference in its entirety.

1. Field of the Invention

The present invention relates generally to solid-state imaging devices such as charged coupled devices for example, and more particularly to a solid-state imaging device with reduced vertical smear.

2. Description of the Related Art

A conventional solid-state imaging device, such as a charge coupled device (CCD), includes a plurality of light collectors. Each light collector (hereinafter referred to as a light sensor) forms one pixel for transforming received light into an electrical signal. The electrical signal is thereafter converted into a digital signal for further processing.

Solid-state imaging devices are classified into a horizontal overflow type and a vertical overflow type. In the horizontal overflow type, a saturated static current is discharged in a horizontal direction. In the vertical overflow type, a saturated static current is discharged in a vertical direction.

Further in the horizontal overflow type, photo-electrically converted static electrons are discharged into a transfer register in the light sensor except a depletion area therein, thereby generating a pseudo signal called as a smear phenomenon. In contrast, in the vertical overflow type solid-state imaging device, the photo-electrically converted static electrons are discharged into a substrate of the light sensor except a depletion area therein. Therefore, the smear phenomenon is relatively less generated for the horizontal overflow type than the vertical overflow type.

FIG. 1 shows a cross sectional view of a conventional vertical overflow type solid-state imaging device. Referring to FIG. 1, an N type light sensor 14, an N type vertical transfer register 16, and a P type channel stopper region 18 are formed within in a first P type well 12. The first P type well 12 is formed on an N type semiconductor substrate 10 which is comprised of silicon for example.

A P type electrical charge storage region 20 is formed on a surface of the light sensor 14, and a second P type well 22 is formed under the vertical transfer register 16. A respective transfer electrode 26 comprised of polysilicon for example is selectively formed over the vertical transfer register 16. A gate insulation layer 24 is interposed between the transfer electrode 26 and the vertical transfer register 16.

A light block layer 30 comprised of a single layer of tungsten (W) or aluminum (Al) for example is formed on the transfer electrode 26. An insulating interlayer 28 is formed between the light block layer 30 and the transfer electrode 26. A surface protection layer 32 comprised of silicon nitride for example is then deposited by a plasma-enhanced chemical vapor deposition (PE-CVD) process for example including over the light block layer 32. A P type area 34 between the light sensor 14 and the transfer register 16 serves as a read-out gate 34.

A portion of the light block layer 30 over the light sensor 14 is selectively removed by an etching process to form an opening 36 through the light block layer 30. Thus, light L is received by the light sensor 14 through the opening 36 for being sensed by the light sensor 14.

Further referring to FIG. 1, the gate insulation layer 24 and the insulating interlayer 28 that are transparent extend from a lower portion of the opening 36 to a top portion of the vertical transfer register 16. Therefore, a portion of the light L is diffracted toward the vertical transfer register 16 via the insulating interlayer 28 and the gate insulation layer 24. Such diffracted light is irradiated onto the vertical transfer register 16 to thereby generate the smear phenomenon.

Reducing a thickness of the insulating interlayer 28 between the light block layer 30 and the light sensor 14 has been suggested for preventing the generation of the smear phenomenon. However, the smear phenomenon is not sufficiently reduced.

In the prior art, the light block layer 30 is a single layer of material that is patterned by an anisotropic (i.e., directional) etching process for precisely aligning the opening 36 over the light sensor 14. Thus, the sidewalls of the light block layer 30 facing the opening 36 have a flat vertical profile. Accordingly, a portion of the light L is refracted from the edge portion of the light block layer 30, and passes to the vertical transfer register 16. As a result, in the conventional solid-state imaging device, an oblique light L1 and/or a reflection light L2 reflected between a surface of the substrate 10 and a lower surface of the light block layer 30 passes into the vertical transfer register 16 for frequent generation of smear phenomenon.

SUMMARY OF THE INVENTION

Accordingly, a solid-state imaging device of embodiments of the present invention is for minimizing such smear phenomenon.

In a general aspect of the present invention, a solid-state imaging device includes a light sensor formed in a semiconductor substrate. In addition, the solid-state imaging device includes a light block layer with an opening formed through the light block layer over at least a portion of the light sensor. Furthermore, at least one sidewall of the light block layer facing the opening is concave shaped.

In another embodiment of the present invention, the solid-state imaging device includes a transfer unit disposed adjacent to the light sensor with the light block layer covering the transfer unit. The transfer unit includes a transfer register formed within the semiconductor substrate, an insulation layer formed on the transfer register, and a transfer electrode disposed on the insulation layer over the transfer register.

In a further embodiment of the present invention, the light block layer includes a first layer, a second layer disposed on the first layer, and a third layer disposed on the second layer. The first, second, and third layers of the light block layer are anisotropically etched to form the opening over the light sensor. In addition, the sidewalls of the first, second, and third layers are isotropically etched with respective materials of the first and third layers etching slower than a respective material of the second layer for forming the concave-shaped sidewall. In an example embodiment of the present invention, the isotropic etching occurs within a cleaning solution.

The present invention may be used to particular advantage when the solid-state imaging device is a CCD (charged coupled device). However, the present invention may be applied for other types of solid-state imaging devices. In this manner, with concave sidewalls of the opening over the light sensor, refracted light entering the transfer register disposed to the side of the light sensor is reduced for in turn reducing undesired smear phenomenon.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4A, 4B, and 4C refer to elements having similar structure and/or function.

DETAILED DESCRIPTION OF THE INVENTION

Figure 1:
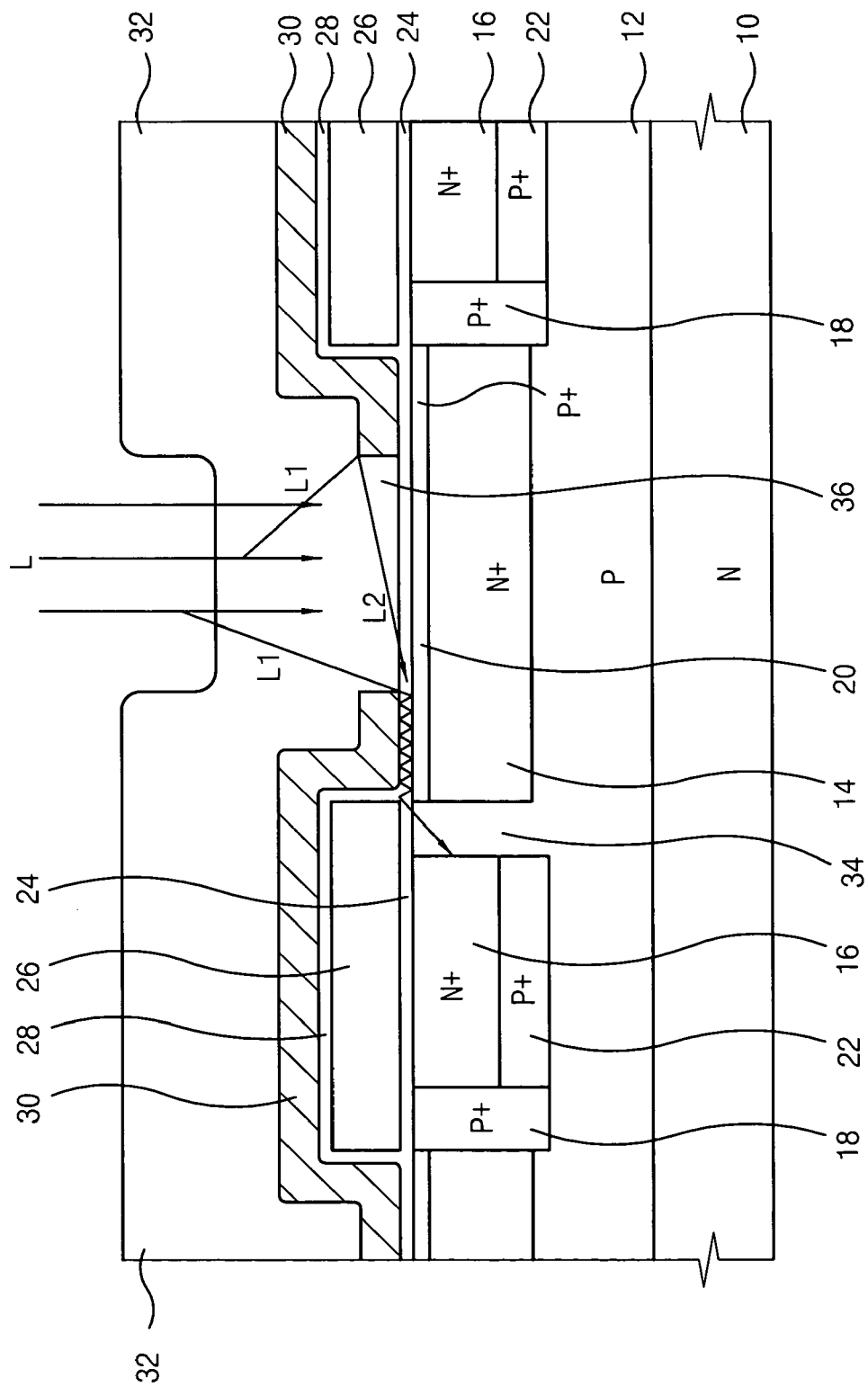
FIG. 1 shows a cross sectional view of a conventional vertical overflow type solid-state imaging device, with smear phenomenon according to the prior art.
Figure 2:
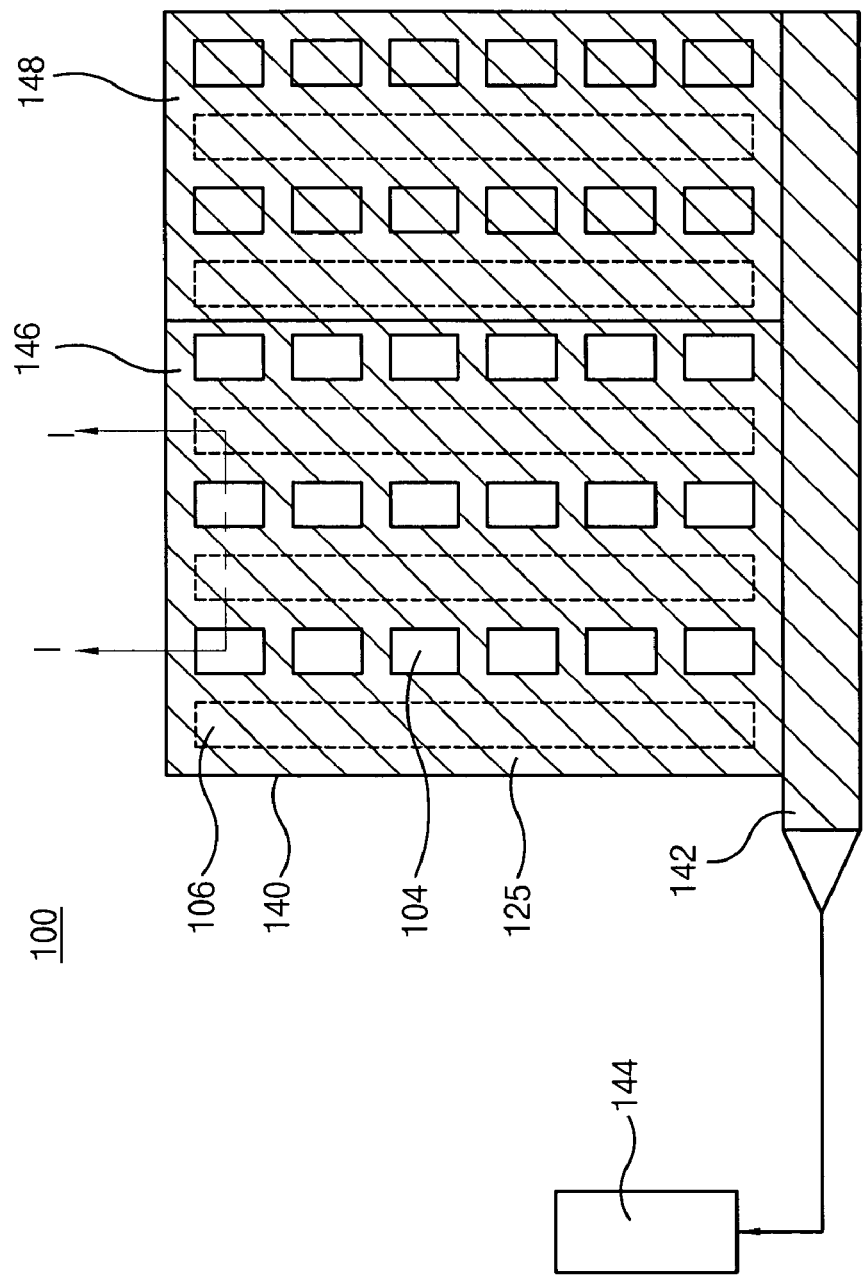
FIG. 2 shows a plan view of a solid-state imaging device with reduced smear phenomenon, according to an embodiment of the present invention.
Figure 3:
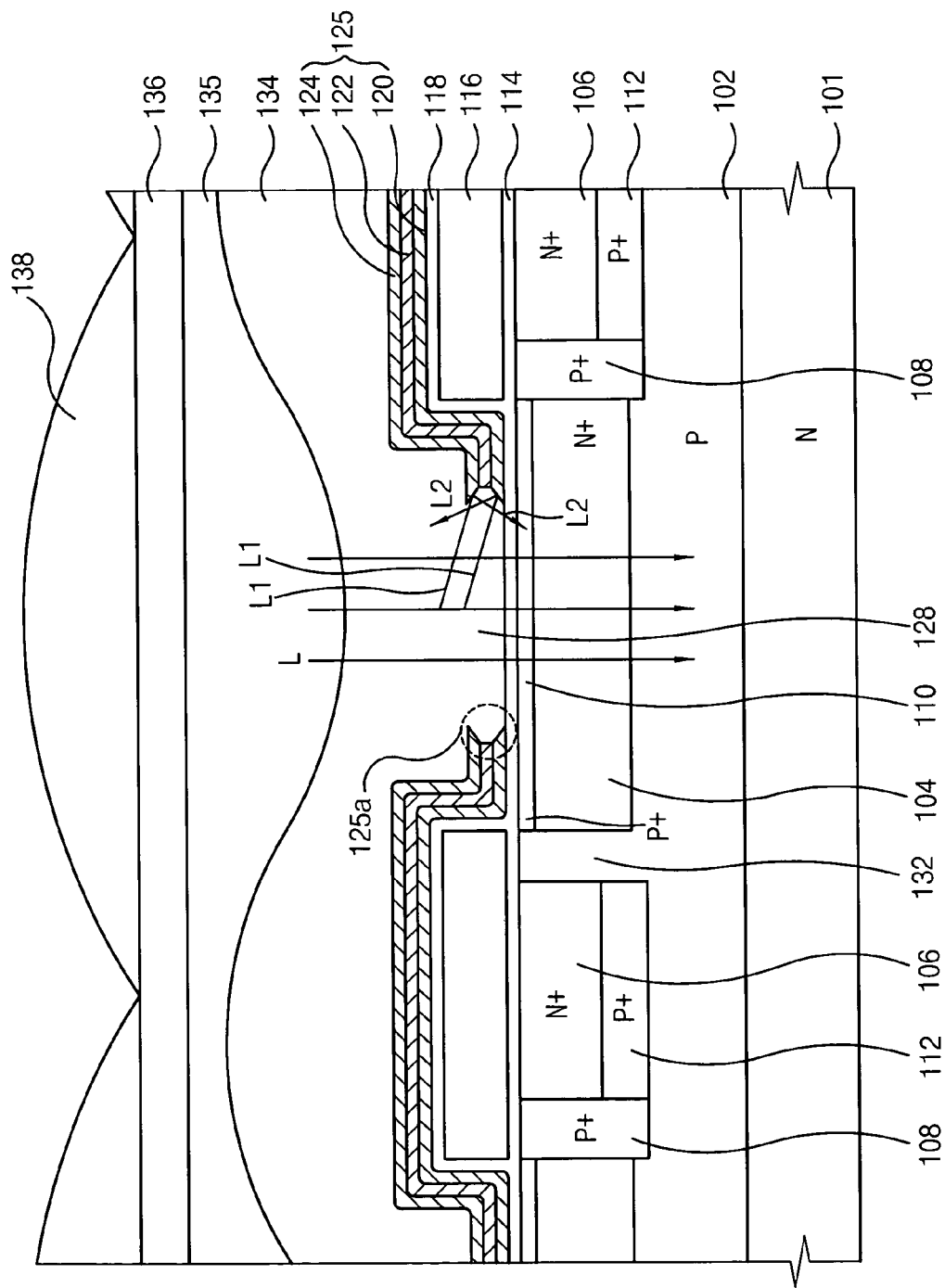
FIG. 3 shows a cross sectional view of the solid-state imaging device along line I-I' of FIG. 2, with concave-shaped sidewalls of a light block layer according to an embodiment of the present invention.

FIG. 2 shows a plan view of a solid-state imaging device 100 according to an embodiment of the present invention. In addition, FIG. 3 shows a cross sectional view for a pixel within an effective pixel region 146 and along line I-I' of FIG. 2. An interchange line transfer type (hereinafter, referred to as IT type) solid-state imaging device is exemplarily disclosed. The IT type solid-state imaging device displays an image using vertical charge transfer electrodes and a horizontal charge transfer electrode.

Referring to FIG. 2, the IT type solid-state imaging device 100 includes an array of light sensors 104, a photographing unit 140 with each of a plurality of vertical transfer registers 106 being aligned next to a column of the light sensors 104, a horizontal transfer register 142 disposed along a side of the photographing unit 140, and an output circuit 144 electrically connected to the horizontal transfer register 142.

A light block layer 125 is formed on any area aside from the area for the light sensors 104 including on the vertical transfer registers 106 of the effective pixel region 146, an optical black region 148, and the horizontal transfer register 142. The optical black region 148 defines a reference level for a black color.

Light L received by the light sensor 104 is photo-electrically converted into electrons that are accumulated as signal charges in the light sensor 104. Such accumulated signal charges are transferred through the vertical transfer register 106 and a transfer electrode (not shown). In addition, the signal charges are transferred into the horizontal transfer register 142, and are output through the output circuit 144.

FIG. 3 shows an N type light sensor 104, an N type vertical transfer register 106, and a P type channel stopper region 108 formed in a P type well 102 of an N type silicon substrate 101. The light sensor 104 and the vertical transfer register 106 of FIG. 3 are for a pixel of the solid-state imaging device 100. The vertical transfer register 106, disposed adjacent the light sensor 104, transfers the accumulated signal charges from the light sensor 104.

A P type electrostatic charge accumulation region 110 is formed on a surface of the light sensor 104, and a second P type well 112 is formed below the vertical transfer register 106. A P type region 132 formed between the light sensor 104 and the vertical transfer register 106 functions as a read-out gate 132.

A transfer electrode 116 is selectively formed over the vertical transfer register 106. A gate insulation layer 114 is formed between the vertical transfer register 106 and the transfer electrode 116. The transfer electrode 116 is comprised of polysilicon in one embodiment of the present invention. The transfer electrode 116 transfers the signal charges that are photo-electrically converted in the light sensor 104 in a vertical direction with the vertical transfer register 106.

Further referring to FIG. 3, the light block layer 125 is comprised of a plurality of layers deposited on the transfer electrodes 116. An insulating interlayer 118 is interposed between the light block layer 125 and the transfer electrodes 116. The light block layer 125 blocks the light from passing into the substrate 101, except in an area over the light sensor 104.

In the example embodiment of FIG. 3, the light block layer 125 includes a first layer 120 formed on the insulating interlayer 118, a second layer 122 formed on the first layer 120, and a third layer 124 formed on the second layer 122. In an example embodiment of the present embodiment, the first and the third layers 120 and 124 are both comprised of a same material such as titanium nitride (TiN) for example, while the second layer 122 is comprised of a different material such as tungsten (W) for example.

Further referring to FIG. 3, first and second surface protection layers 134 and 135 through which the light L penetrates are formed after the light block layer 125 is formed. For example, the first protection layer 134 is comprised of a material having a relatively low refraction index such as borophosphor silicate glass (BPSG), and the second protection layer 135 is comprised of a material having a relatively high refraction index such as silicon nitride (SiN).

The first protection layer 134 is formed to have convex and concave portions by re-flowing BPSG, and the second protection layer 135 is formed to have a flat surface. The refraction index of silicon nitride is about twice that of BPSG such that the first and second protection layers 134 and 135 act as an inner condensing lens for condensing the light L into the light sensor 104. A color filter layer 136 is formed on the second protection layer 135, and an on-chip lens 138 for further condensing the light L is formed over each light sensor 104.

Further referring to FIG. 3, a portion of the light block layer 125 over the light sensor 104 is selectively etched away to form an opening 128 through the light block layer 125. The light L is irradiated onto the light sensor 104 through the opening 128. A sidewall 125a of the light block layer 125 facing the opening 128 is formed to have a concave-shape. Thus, the first and third layers 120 and 124 of the light blocking layer 125 protrude further into the opening 128.

Accordingly, an oblique light component L1 of the light L refracted at the sidewall 125a of the light block layer 125 is substantially reflected upward to the surface protection layer 134 or downward to the substrate 101. Thus, the portion of a reflected light L2 irradiated into the vertical transfer register 106 through the insulating interlayer 118 under the light block layer 125 is reduced to in turn decrease the smear phenomenon.

Figure 4A:
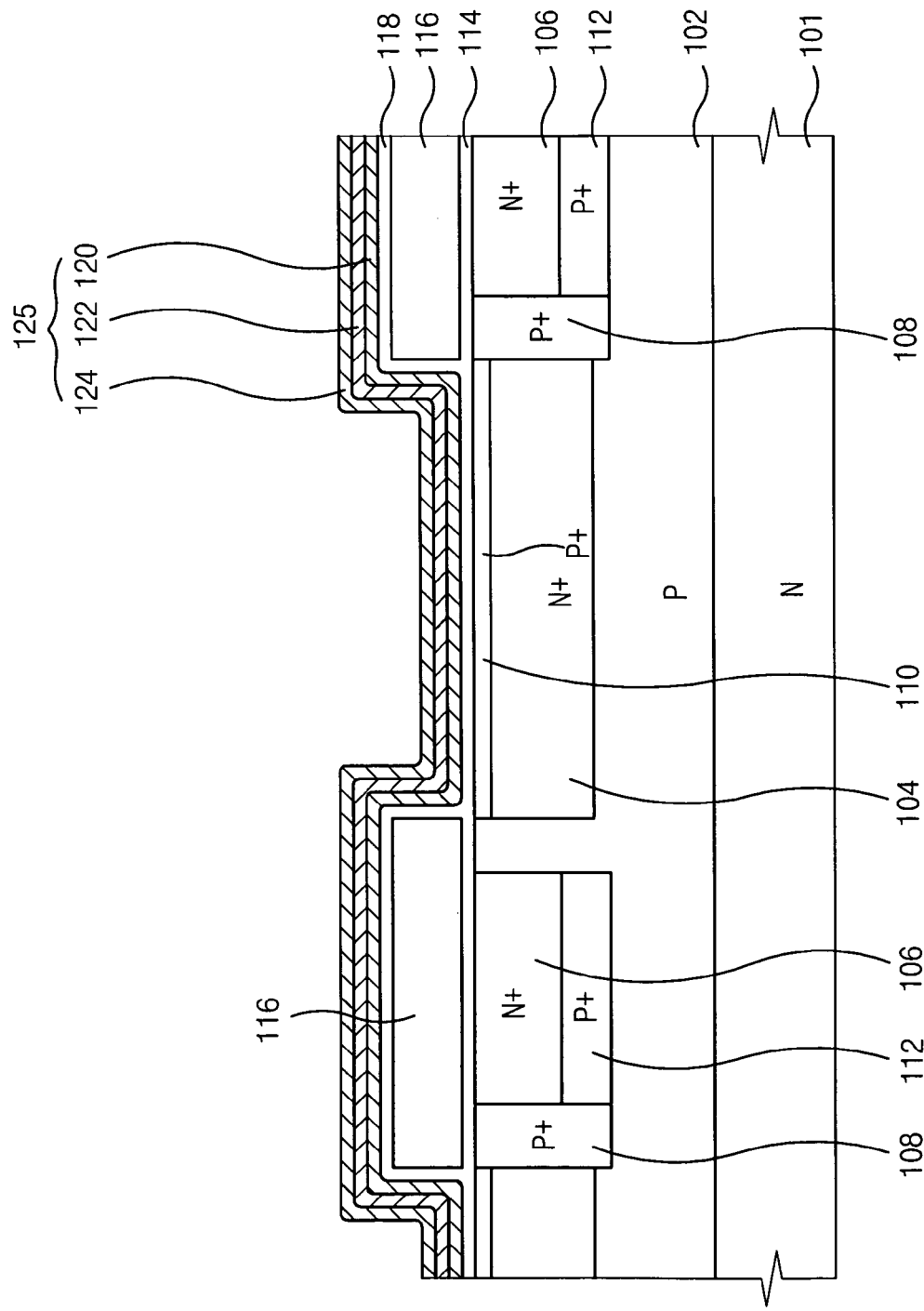
FIGS. 4A, 4B, and 4C show cross-sectional views during steps for fabricating the solid-state imaging device of FIG. 3, according to an embodiment of the present invention.

Hereinafter, fabrication of the above solid-state imaging device of FIG. 3 is described with reference to FIGS. 4A, 4B, and 4C. Referring to FIG. 4A, the first P type well 102, the N type light sensor 104, the N type vertical transfer register 106, the P type channel stopper region 108, the second P type well 112, and the P type electrostatic charge accumulation region 110 are formed on the N type silicon substrate 101 by ion implantation processes and deposition processes.

In addition, the transfer electrode 116 comprised of polysilicon for example is formed over the vertical transfer register 106. The gate insulation layer 114 is formed between the transfer electrode 116 and the vertical transfer register 106. The insulating interlayer 118 is formed on a surface of the substrate 101 to cover the transfer electrode 116. The light block layer 125 is thereafter formed over the surface of the substrate 101 to cover the insulating interlayer 118.

In the example embodiment of FIG. 4A, the light block layer 125 is comprised of the first, second, and third layers 120, 122, and 124. In an example embodiment, the first layer 120 is deposited on the insulating interlayer 118 and is comprised of titanium nitride (TiN) having a thickness of about 300 Å to about 500 Å formed in a sputtering process or a chemical vapor deposition (CVD) process.

Thereafter, the second layer 122 is deposited on the first layer 120 and is comprised of tungsten (W) having a thickness of about 300 Å to about 500 Å formed in a sputtering process or a chemical vapor deposition (CVD) process. Subsequently, the third layer 124 is deposited on the second layer 122 and is comprised of titanium nitride (TiN) having a thickness of about 300 Å to about 500 Å formed in a sputtering process or a chemical vapor deposition (CVD) process.

In this manner, the first and third layers 120 and 124 are comprised of a same material that is different from the material of the second layer 122. In addition, the etch selectivity of the first and third layers 120 and 124 is substantially the same but is different from the etch selectivity of the second layer 122.

Figure 4B:
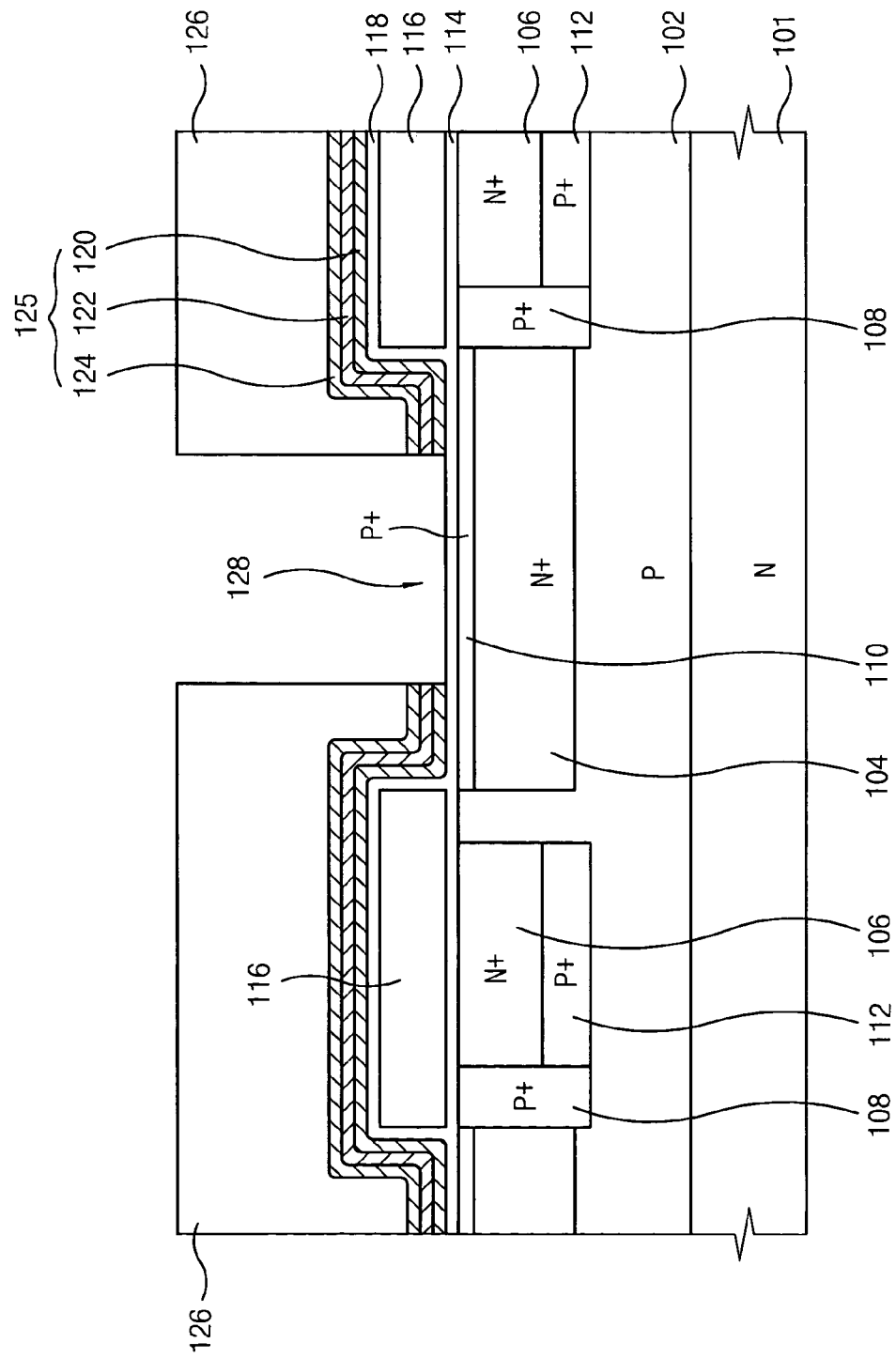

Referring to FIG. 4B, an opening 128 is formed through the light block layer 125. A photoresist film 126 is formed on the light block layer 125 and is patterned for exposing a portion of the light block layer 125 over at least a portion of the light sensor 104. Subsequently, the portion of the third layer 124, the second layer 122, and the first layer 120 exposed through the photoresist film 126 is anisotropically (directionally) etched to form the opening 128 through such layers 124, 122, and 120.

Figure 4C:
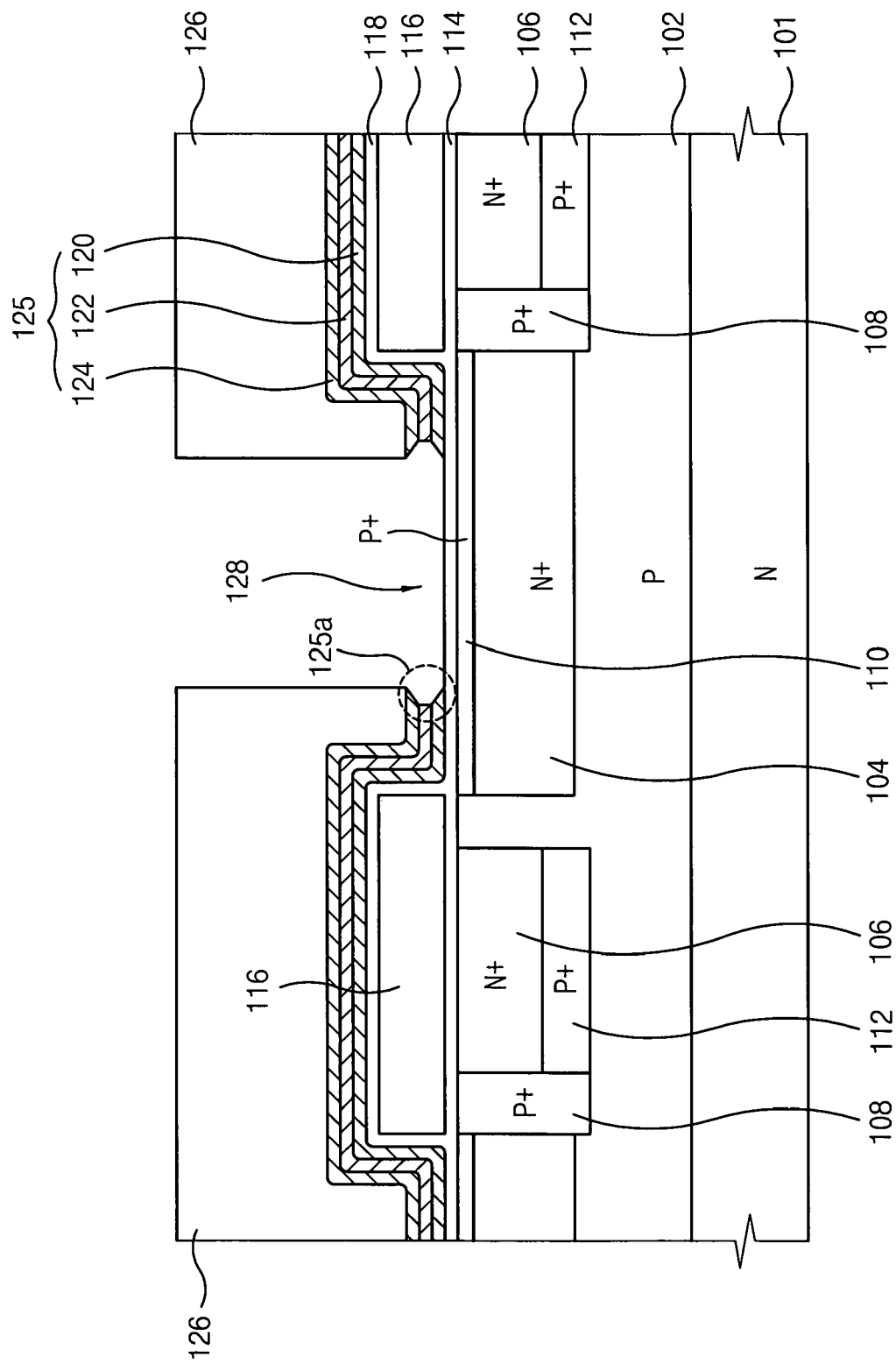

FIG. 4C illustrates a step of forming sidewalls 125a of the light block layer 125 to be concave according to an embodiment of the present invention. After forming the opening 128 in FIG. 4B, an isotropic (non-directional) etching process such as a wet etching process is performed using the photoresist pattern 126 as an etching mask.

During such isotropic etching, the second layer 122 has higher etching rate than the first and third layers 120 and 124. For example, the isotropic etching process uses an etchant such as hydrogen peroxide ($H_2O_2$) solution that more rapidly etches the second layer 122 than the first and third layers 120 and 124. Thus, the sidewalls 125a of the light block layer 125 facing the opening 128 are formed to have a concave shape.

Thereafter referring to FIGS. 4C and 3, an ashing and/or a stripping process is performed to remove the photoresist 126. In addition, the surface protection layers 134 and 135 through which the light L passes is formed over the light block layer 125 and the light sensor 104.

In this manner, anisotropic and isotropic etching processes are performed for patterning the light block layer 125 using one photoresist film 126 for forming the opening 128 over the light sensor 104. With the isotropic etching process, the sidewalls 125a of the light block layer 125 facing the opening 128 are formed to have a concave-shape for reducing smear phenomenon.

In another embodiment of the present invention, the isotropic etching process for etching away the second layer 122 more rapidly than the first and third layers 120 and 124 may occur during a pre-cleaning process before deposition of the surface protection layers 134 and 135. In that case, a separate isotropic etching process is not needed.

For example, as described with reference to FIG. 4B, the third layer 124, the second layer 122, and the first layer 120 exposed through the photoresist 126 are anisotropically etched to form the opening 128. Then, the photoresist 126 is removed using an ashing and/or stripping process. Subsequently, various foreign matters on a surface of the light block layer 125 and the light sensor 104 are removed by a cleaning process using a standard cleaning 1 (SC-1) solution that includes ammonium hydroxide ($NH_4OH$), hydrogen peroxide ($H_2O_2$), and deionized water ($H_2O$).

In such a cleaning solution, when the first and third layers 120 and 124 are comprised of titanium nitride (TiN) and the second layer 122 is comprised of tungsten (W), the second layer 122 is more rapidly etched than the first and third layers 120 and 124. Accordingly, such a pre-cleaning process results in the sidewalls 125a of the light block layer 125 having the concave shape without an additional isotropic etching process.

While the present invention has been particularly shown and described with reference to exemplary embodiments thereof, it will be understood by those of ordinary skill in the art that various changes in form and details may be made therein without departing from the spirit and scope of the present invention as defined by the following claims.

Thus, the foregoing is by way of example only and is not intended to be limiting. For example, although the present embodiment is exemplarily described with regard to the IT type solid-state imaging device, a frame-interline transfer (FIT) type solid-state imaging device may also be implemented with the present invention. In addition, any numbers of elements illustrated and described herein are by way of example only. In addition, the present invention has been described for a CCD (charge coupled device). However, the present invention may also be used for any other type of solid-state image devices. The present invention is limited only as defined in the following claims and equivalents thereof.

What is claimed is:

1. A method of fabricating a solid-state imaging device, comprising:

forming a light sensor within a semiconductor substrate;

depositing a first layer, a second layer on the first layer, and a third layer on the second layer for forming the light block layer over the light sensor, the first and third layers having an etching selectivity with respect to the second layer;

anisotropically etching the first, second, and third layers of the light block layer to form the opening over the light sensor; and isotropically etching the sidewalls exposed by the opening of the first, second, and third layers, so that the sidewalls of the first and third layers are protruded toward the opening compared with the sidewall of the second layer.

2. The method of claim 1, wherein the first and third layers are comprised of a same material that is different from a material of the second layer.

3. The method of claim 1, wherein the first and third layers are comprise of titanium nitride (TiN) and the second layer is comprised of tungsten (W).

4. The method of claim 1, wherein the isotropic etching occurs within a cleaning solution.

5. The method of claim 4, wherein the cleaning solution is a standard cleaning 1 (SC-1) solution including ammonium hydroxide ($NH_4OH$), hydrogen peroxide ($H_2O_2$) and deionized water.

6. The method of claim 1, further comprising:
  forming a transfer register within the semiconductor substrate;
  forming an insulation layer on the transfer register;
  forming a transfer electrode on the insulation layer over the transfer register; and
  forming the light block layer over the transfer electrode.

7. The method of claim 1, further comprising: forming a protection layer covering the light sensor and the light block layer.

8. The method of claim 1, wherein the solid-state imaging device is a CCD (charged coupled device).

* * * * *